(12) United States Patent
Constantine et al.

(10) Patent No.: US 6,504,449 B2
(45) Date of Patent: Jan. 7, 2003

(54) PHASE COMPENSATED SWITCHED ATTENUATION PAD

(75) Inventors: Cornelius Constantine, Morgan Hill, CA (US); Richard G. Barber, Morgan Hill, CA (US)

(73) Assignee: le;.5qAnritsu Company, Morgan Hills, CA (US)

( * ) Notice: Subject to any disclaimer, the term of this patent is extended or adjusted under 35 U.S.C. 154(b) by 0 days.

(21) Appl. No.: 09/778,578

(22) Filed: Feb. 7, 2001

(65) Prior Publication Data

US 2001/0033206 A1 Oct. 25, 2001

Related U.S. Application Data

(60) Provisional application No. 60/180,508, filed on Feb. 7, 2000.

(51) Int. Cl.[7] ............................................. H03H 11/24
(52) U.S. Cl. ...................................... 333/103; 327/308
(58) Field of Search .............................. 333/81 A, 103, 333/81 R, 17.2; 327/308

(56) References Cited

U.S. PATENT DOCUMENTS 4,890,077 A * 12/1989 Sun ........................ 333/81 A
5,049,841 A * 9/1991 Cooper et al. ............ 333/81 R

* cited by examiner

Primary Examiner—Robert Pascal
Assistant Examiner—Joseph Chang
(74) Attorney, Agent, or Firm—Fliesler Dubb Meyer & Lovejoy LLP (57) ABSTRACT

A phase compensated switched attenuation device 6 is provided for attenuating high frequency signals while maintaining an insertion loss of less than 1 dB up to 3 GHz. A single GaAs FET 12 is coupled between input port 8 and output port 9 in parallel with a 20 dB pad 10 for switching the device 6 between a through state and an attenuation state. First and second isolation FETs 14 and 16 are coupled between the GaAs FET 12 and pad terminals 18 and 19 to isolate the GaAs FET 12, decrease return loss when the GaAs FET 12 is on, and increase isolation of the GaAs FET 12 from the pad 10 when the GaAs FET 12 is on. A resistor 24 or a series combination of a resistor 24 and capacitor 26 can be coupled to the pad terminals 18 and 19 in parallel with the pad 10 to improve return loss when the GaAs FET 12 is on. Resistors 21, 22, and 23 are also provided to reduce distortion, coupling gates of the FETs 12, 14, and 16 to a plurality of voltage references V1 and V2.

16 Claims, 9 Drawing Sheets

PHASE COMPENSATED SWITCHED ATTENUATION PAD

This application claims priority to Provisional Application Serial No. 60/180,508, filed Feb. 7, 2000, entitled "Phase Compensated Switched Attenuation Pad."

BACKGROUND OF THE INVENTION

1. Field of the Invention

The present invention relates to a switched attenuator for selectively attenuating high frequency signals. More particularly, the present invention relates to a switched attenuator which maintains linearity across a wide frequency range.

2. Description of the Related Art

Figure 1:
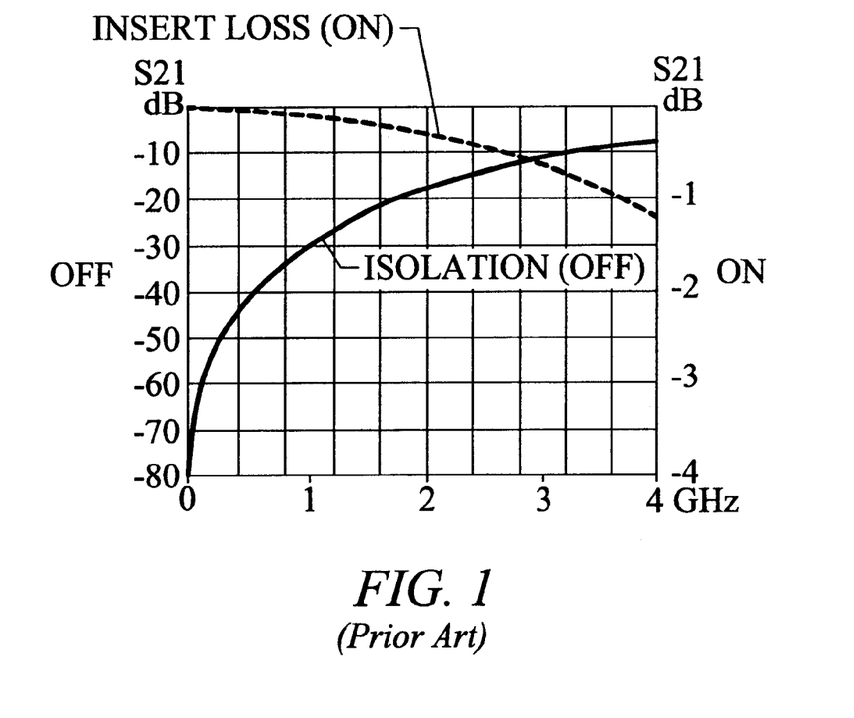
FIG. 1 illustrates a typical S21 isolation response and insertion loss of a GaAs FET.

Due to parasitic capacitance, a Gallium-Arsenide (GaAs) FET will present a decreasing isolation as a function of frequency when turned off. This is illustrated by the solid line in FIG. 1 which shows a typical S21 isolation response of a GaAs FET in an off state. FIG. 1 also shows a dotted line representing the typical insertion loss of a GaAs FET in an on state.

Figure 2:
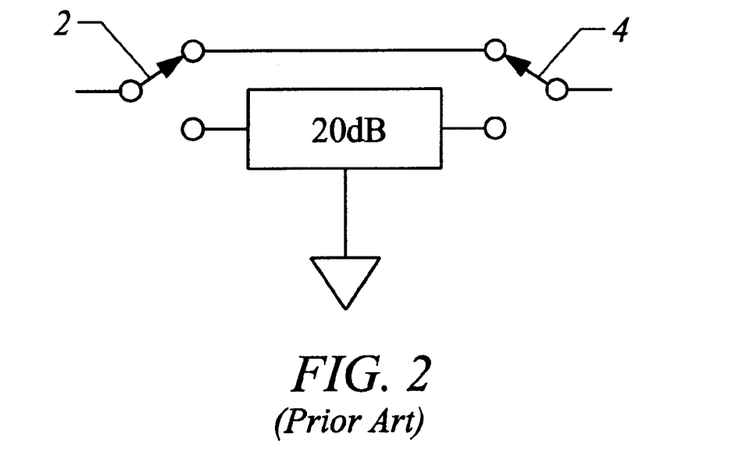
FIG. 2 illustrates a typical configuration for a switched attenuator which includes two GaAs FET's.

Due to the isolation characteristics, just one GaAs FET is not typically used in a switched 20 dB pad which is intended to function up to 3 GHz. In the on state, a single GaAs FET can have an insertion loss lower than −1 dB at 3 GHz. Such a low insertion loss, as illustrated in FIG. 1, which is associated with the low on state return loss, is not identified as being provided in FET attenuators advertised by current manufacturers. FIG. 2 shows a prior art switched attenuator which includes two GaAs FET's to form the switches 2 and 4.

SUMMARY OF THE INVENTION

In accordance with the present invention, a phase compensated switched attenuation device is provided for attenuating high frequency signals. In one embodiment, a through-path GaAs FET is coupled between input and output ports for switching the device between a through state and an attenuation state. First and second isolation FET's are coupled to the input port and output port, respectively for isolating the through-path FET from a pad coupled to the isolation FET's. A resistor or a series combination of a resistor and capacitor can be coupled to the first and second isolation FET's in parallel with the pad. Resistors are provided for coupling gates of the FET's to a plurality of voltage sources. A device in accordance with one embodiment of the present invention can maintain an insertion loss of less than 1 dB for frequencies up to 3 GHz.

BRIEF DESCRIPTION OF THE DRAWINGS

Further details of the present invention are explained with the help of the attached drawings in which.

DETAILED DESCRIPTION

Figure 3:
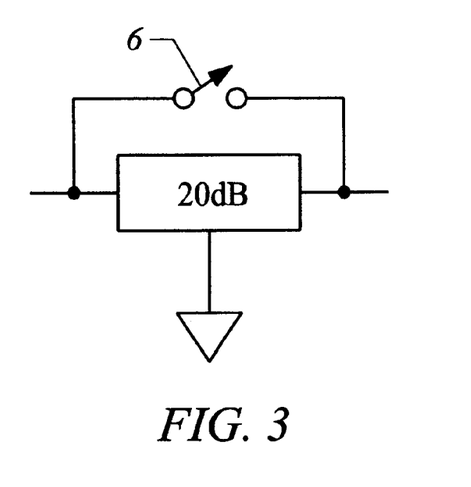
FIG. 3 illustrates a block diagram representation of a switched attenuator in accordance with the present invention.

FIG. 3 illustrates a configuration for a switched attenuator in accordance with the present invention. The switched attenuator shown uses a single GaAs FET to provide a switch 6, enabling the attenuator to provide an insertion loss as low as −1 dB for frequencies up to 3 GHz.

Using a single GaAs FET in parallel with a pad like the 20 dB pad shown will, however, cause the return loss of the FET to drastically deteriorate with frequency in the through state when the FET is on. Also, the linearity of attenuation of the pad will deteriorate with frequency in the attenuation state when the FET is off. For this reason, the topology of the switch in accordance with the present invention further includes two more FET's to isolate the through-path FET from the pad.

Figure 4:
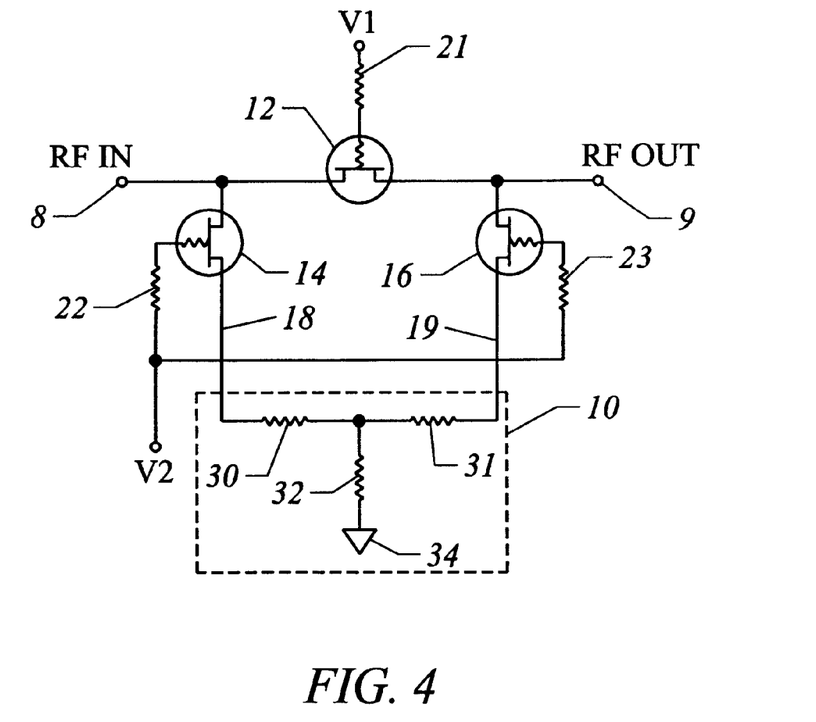
FIG. 4 provides a circuit schematic of a switched attenuator in accordance with the present invention.

FIG. 4 shows circuitry for a switched attenuator in accordance with the present invention. The switched attenuator includes a pad 10 having terminals 18 and 19 coupled to resistors 30 and 31 respectively, and a resistor 32 coupled between a ground 34 and resistors 30 and 31. The switched attenuator further includes input port 8, output port 9, FET transistors 12, 14, and 16, and resistors 21–23 for biasing the FETs 12, 14, and 16. The FET transistor 12 is a GaAs device which forms the switch 6, as shown in FIG. 3, which is in parallel with the pad 10. The resistor 21 connects the gate of the FET 12 to a voltage reference V1. The FETs 14 and 16 form isolation transistors which have gates biased by resistors 22 and 23 which connect to a voltage reference V2. In one embodiment, resistor 23 connects to a different voltage reference V3 (not shown). The resistors 21–23 between the gates of the FETs and the voltage potentials V1 and V2 reduce distortion at different power levels.

Figure 5:
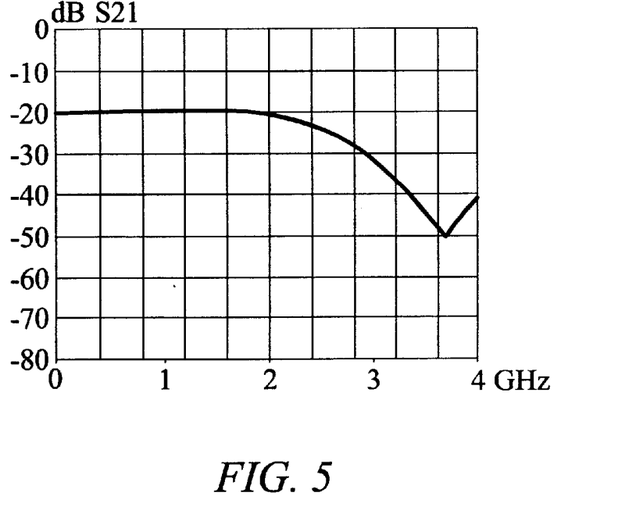
FIG. 5 illustrates an S21 attenuation response for a switched attenuator in accordance with the present invention.

In the through state with FET 12 on and FET's 14 and 16 off, the parasitic off state capacitance of the two isolation transistors 14 and 16 can be relatively easy compensated for to provide a good return loss using a low pass filter design approach. In the attenuation state with the FET 12 off and the FET's 14 and 16 on, the parasitic inductance of the isolation FET's will change in phase opposite with that of the parasitic capacitance of the through FET 12. Depending on the parasitic inductance and capacitance values, the attenuation will present a sharp (notch) minimum at some frequency as shown in FIG. 5 for a 20 dB attenuator pad. This is due to the fact that the over topology for the attenuator circuit is similar to a notch filter. Compensating microstrip lines and parasitic inductances and capacitances are not shown in FIG. 4.

Thus, with the circuit of FIG. 4, isolation is not lower as frequency gets higher as shown for a single transistor in FIG. 1. However, at some higher frequency (near 3.5 GHz in FIG. 5) isolation is higher. Because of the relatively simple electrical circuit, it is possible to compensate for the parasitic capacitance of the FET 12 with good linearity up to the notch frequency.

Figure 6:
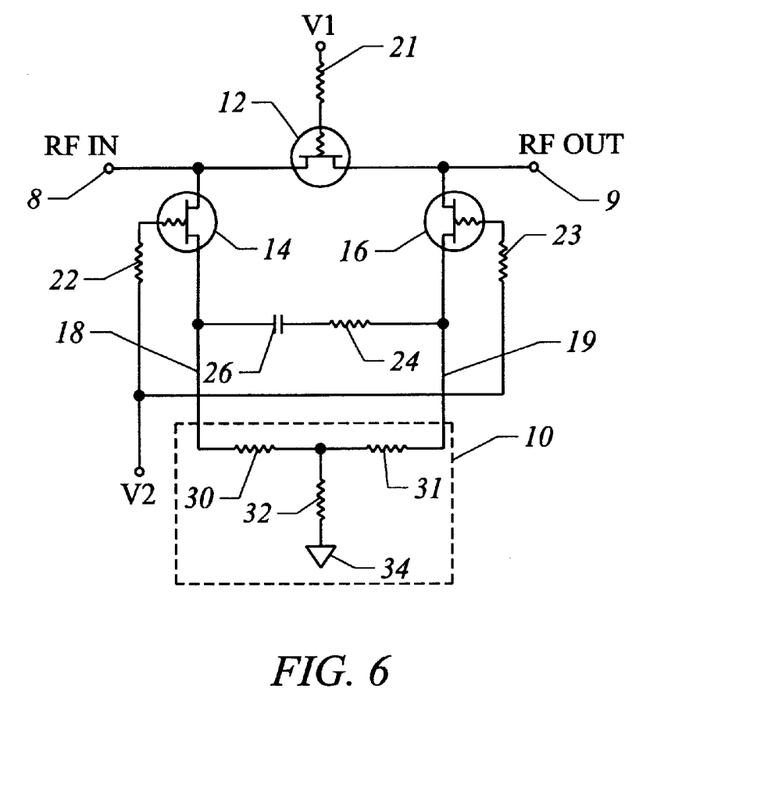
FIG. 6 provides a circuit schematic of an alternate embodiment of a switched attenuator in accordance with the present invention.
Figure 7:
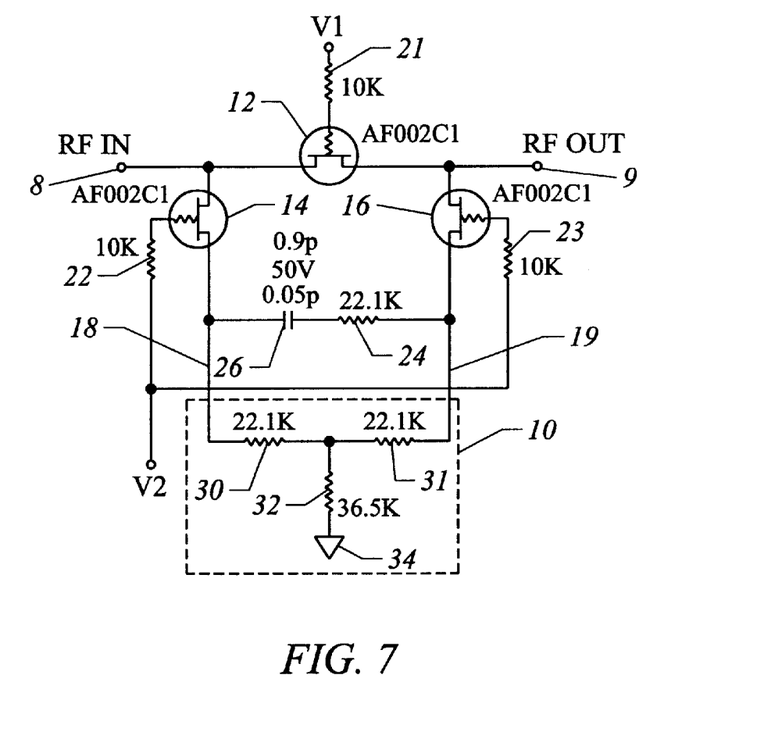
FIG. 7 provides a circuit schematic with representative component types and sizes of a switched attenuator in accordance with the present invention.

FIG. 6 shows modifications to the circuit of FIG. 4 to provide improved linearity and return loss up to 3 GHz. The modifications include providing a resistor 24 in parallel with FET 12. A capacitor 26 can be coupled in series with resistor 24. FIG. 7 shows the circuit of FIG. 6 with representative component types and sizes to provide a 10 dB switched pad. Although specific components are shown in FIG. 7, other devices could be used depending on desired design requirements with pad values ranging up to 25 dB. The circuit of FIG. 7 was tested for 20 dBm power with good results, but it is believed to withstand much more power.

Figure 8:
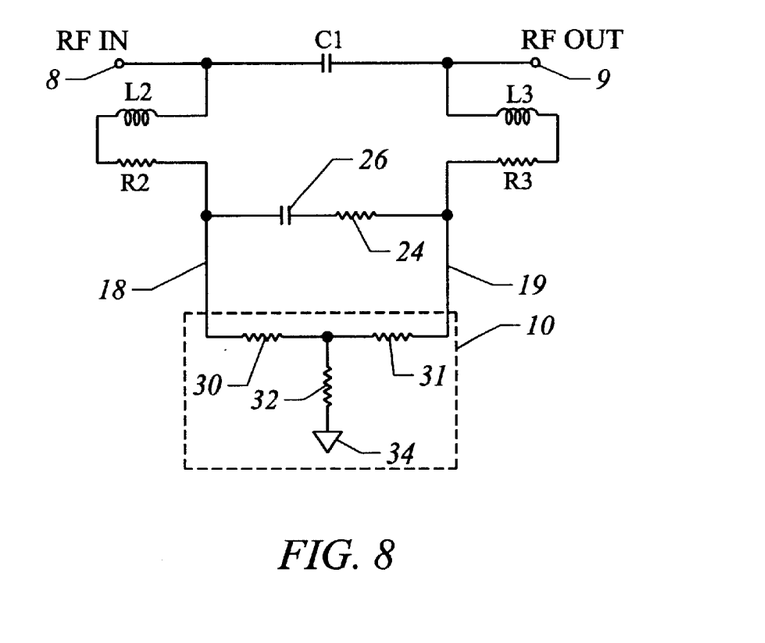
FIG. 8 illustrates an equivalent circuit for one configuration of the circuit illustrated in FIG. 7.

FIG. 8 shows an equivalent circuit for the components of FIG. 7 with FET 12 turned on and FET's 14 and 16 turned off. As shown, FET 14 is modeled by its parasitic inductance L2 and a resistance R2 while FET 16 is modeled by its parasitic inductance L3 and a resistance R3. The FET 12 is modeled by its parasitic capacitance C1. With FET 12 turned off and FET's 14 and 16 turned on, the components for FET's 14 and 16 could be exchanged for a parasitic capacitance, while the components for FET 12 would change to a parasitic inductance and resistance connected in series.

Figure 9:
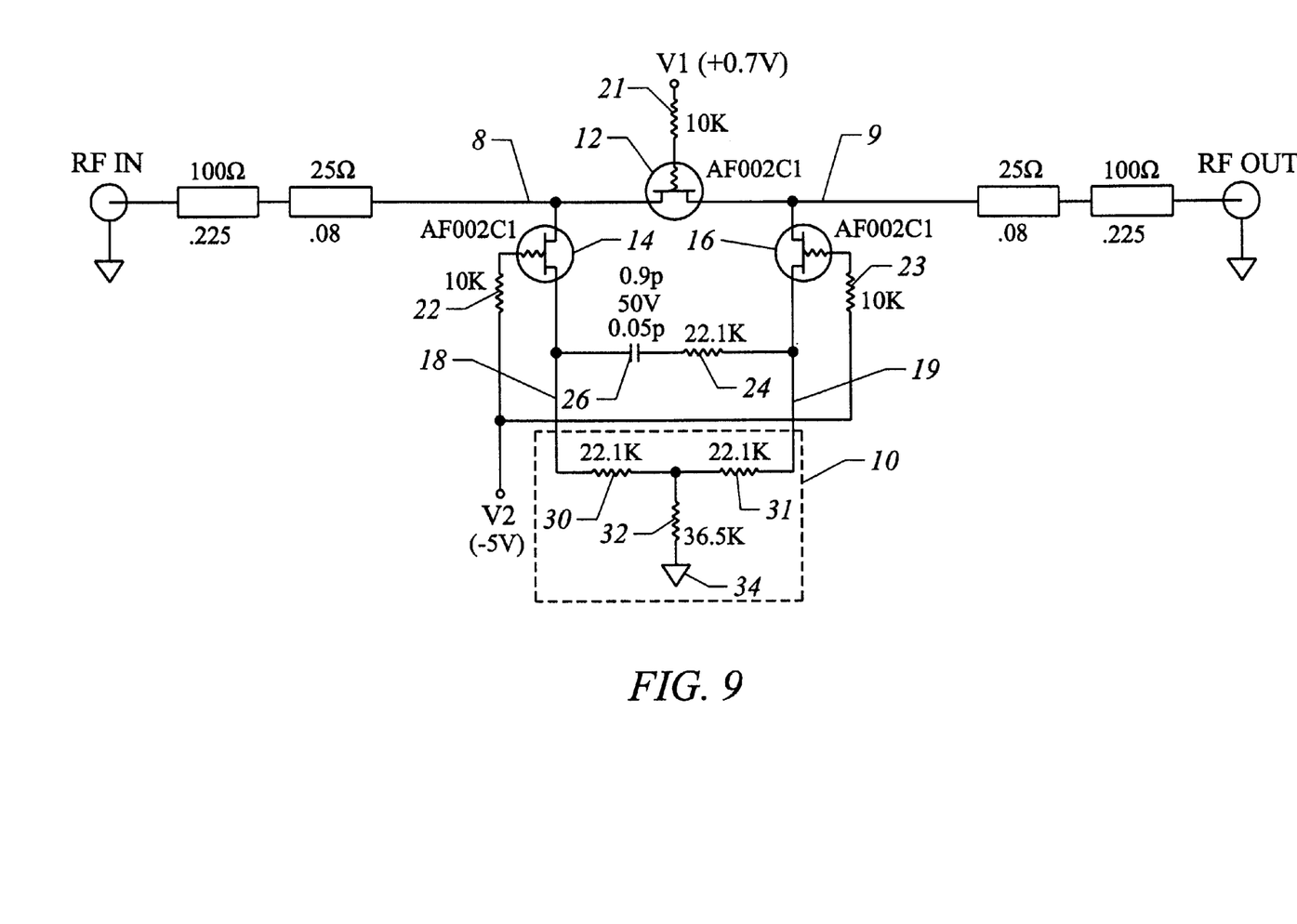
FIG. 9 illustrates a test setup for testing the circuit illustrated in FIG. 7.

FIG. 9 shows a test setup for the circuit of FIG. 7. In the test setup a 100 ohm microstrip transmission line of 0.225 inch and a 25 ohm line of 0.08 inch are connected in series to input port 8 to provide the RF IN to the switched attenuator, and output port 9 to provide the RF OUT from the switched attenuator. The voltage V1 is set at 0.7 volts and the voltage V2 is set at −5 volts.

Figure 10:
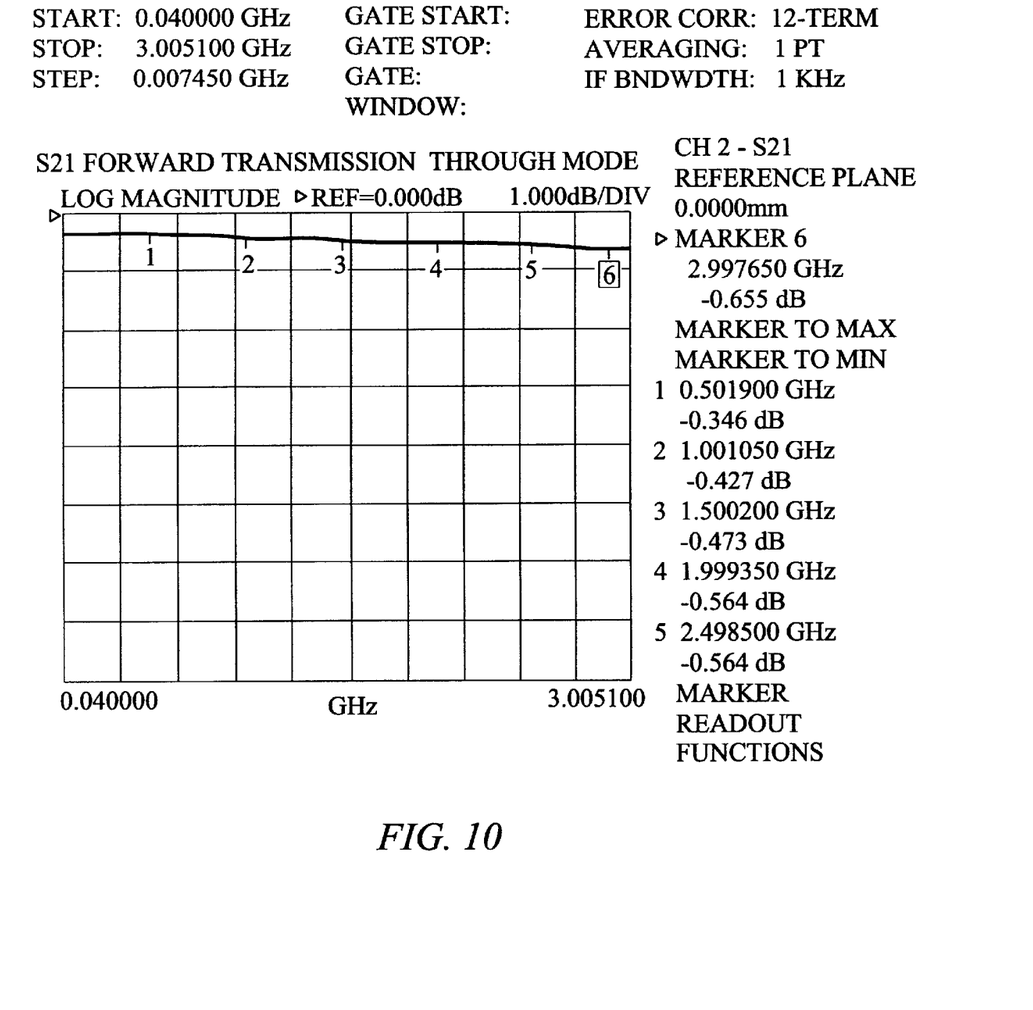
FIG. 10 illustrates S21 forward transmission measurements for a switched attenuator in a through mode of operation in accordance with the present invention.
Figure 11:
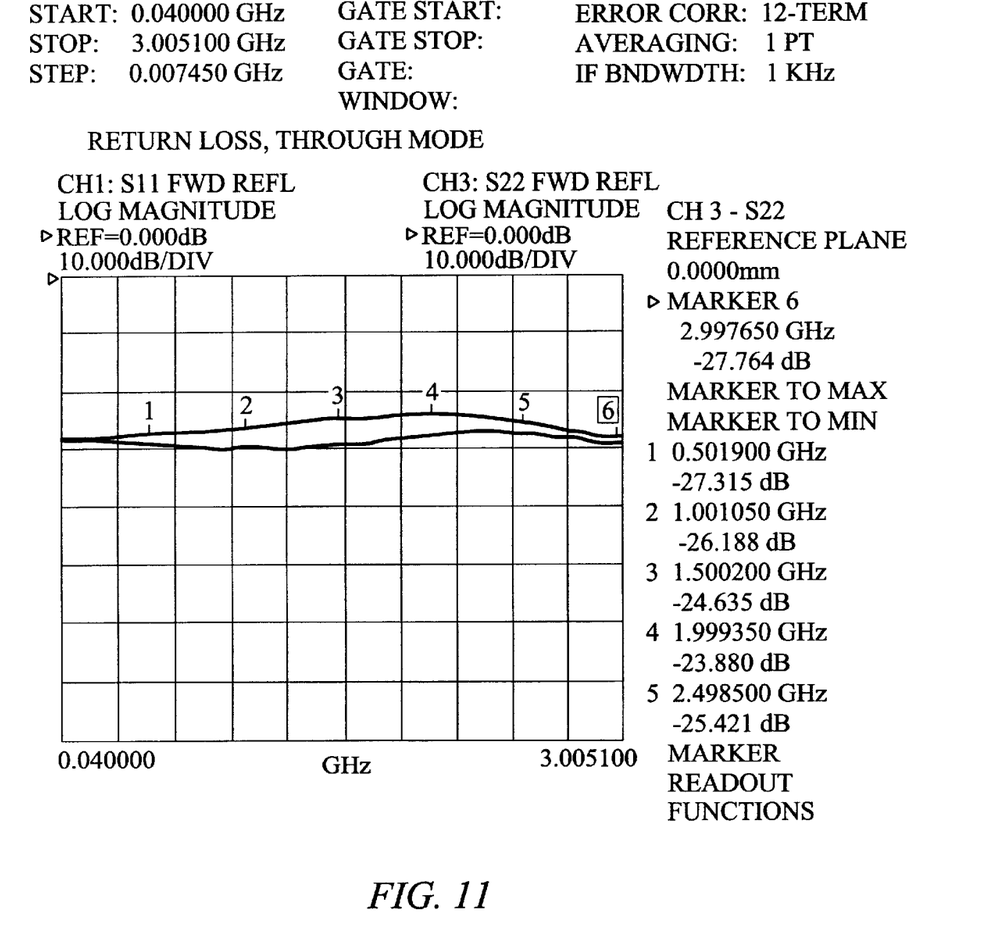
FIG. 11 illustrates S11 return loss measurements for a switched attenuator in a through mode of operation in accordance with the present invention.
Figure 12:
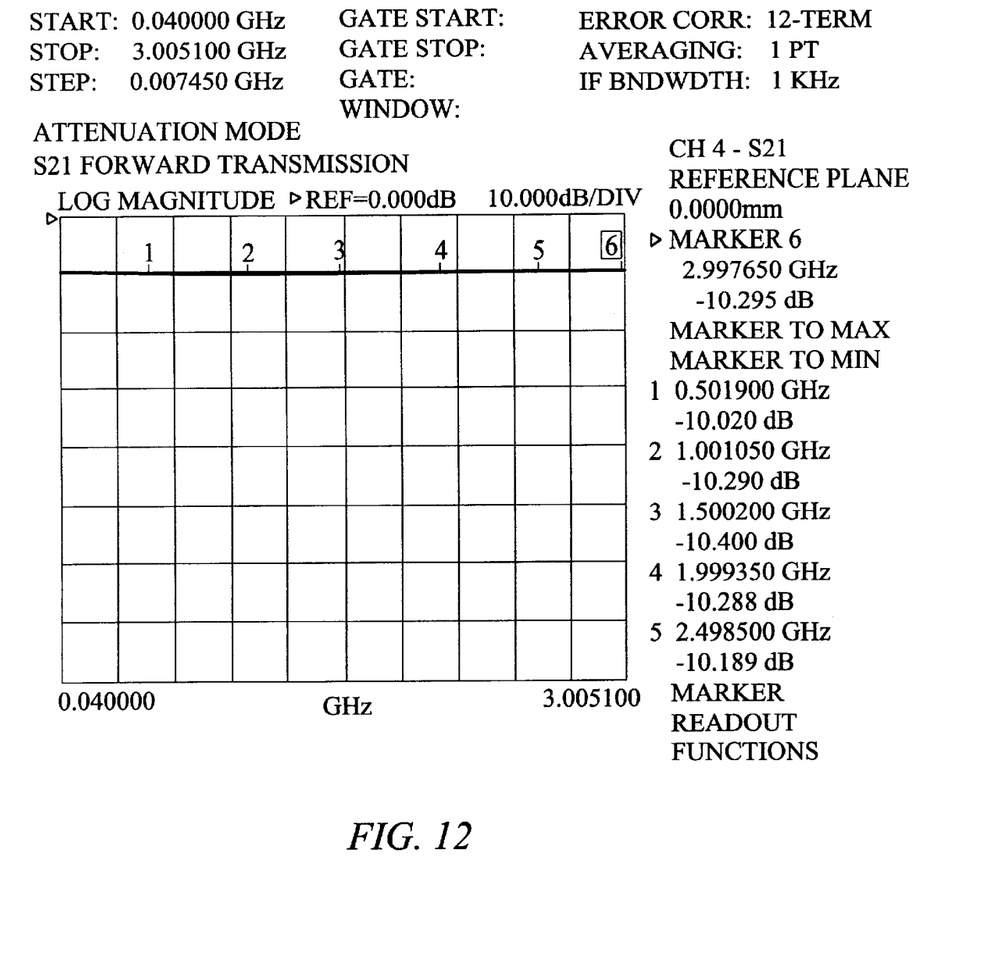
FIG. 12 illustrates S21 forward transmission measurements for a switched attenuator in an attenuation mode of operation in accordance with the present invention.
Figure 13:
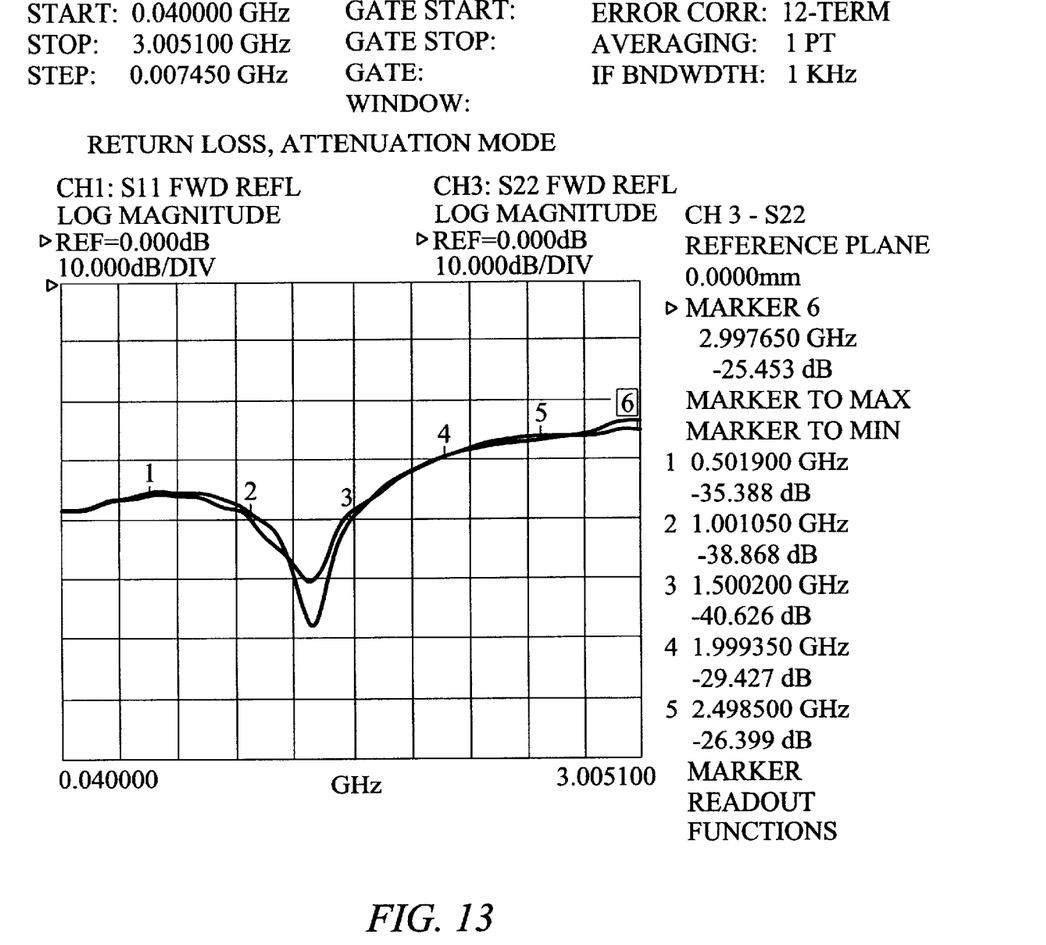
FIG. 13 illustrates S11 return loss measurements for a switched attenuator in an attenuation mode of operation in accordance with the present invention.

The results of tests using the circuit of FIG. 9 are shown in FIGS. 10–13. FIG. 10 shows S21 forward transmission measurements with the FET 12 turned on in a through mode. As shown, the insertion loss remains below 1 dB over a 3 GHz range. FIG. 11 shows S11 return loss measurements with the FET 12 on in the through mode. As shown, return loss remains below 20 dB over a 3 GHz range. FIG. 12 shows S21 forward transmission measurements with the FET 12 turned off in an attenuation mode. As shown, the attenuation remains near the 10 dB value of the pad over a 3 GHz range. FIG. 13 shows S11 return loss measurements with the FET off in the attenuation mode. As shown, the return loss remains below 25 dB over the 3 GHz range.

The circuit of FIG. 7 can be used for switched pads for much higher frequencies if a hybrid or MMIC technology is used, the topology providing performance far exceeding performance of switched pads now available from manufacturers.

Although the present invention has been described above with particularity, this was merely to teach one of ordinary skill in the art how to make and use the invention. Many additional modifications will fall within the scope of the invention, as that scope is defined by the claims which follow.

What is claimed is:
1. A switched attenuation device, comprising:
an input port;
an outport port;
a through-path FET having a source-drain path coupled between said input and output ports;
a pad having a first terminal and a second terminal;
a first isolation FET having a source-drain path coupled from said first terminal of said pad to said input port; and
a second isolation FET having a source-drain path coupled from said second terminal of said pad to said output port, said through-path FET and isolation FETs capable of routing a signal from said input port through said pad to said output port, wherein said signal is isolated from said source-drain path of said through-path FET and attenuated by said pad.
2. The device of claim 1, wherein said through-path FET is a GaAs FET.
3. The device of claim 1, further comprising:
a first resistor coupled to a gate of said first isolation FET, said first resistor further coupled to a first voltage source;
a second resistor coupled to a gate of said second isolation FET, said second resistor further coupled to a second voltage source; and
a third resistor coupled to a gate of said through-path FET, said third resistor further coupled to a third voltage source.
4. The device of claim 3, wherein said first and second voltage sources are the same voltage source.
5. The device of claim 1, further comprising:
a parallel resistor coupled between said first and second terminals of said pad.
6. The device of claim 5, further comprising:
a capacitor coupled in series with said parallel resistor.
7. A switched attenuation device, comprising:
an input port;
an output port;
a through-path FET having a source-drain path coupled between said input and output ports;
a pad having a first terminal and a second terminal, wherein said pad comprises:
a first resistor having a first terminal coupled to said first terminal of said pad;
a second resistor having a first terminal coupled to said second terminal of said pad, and a second terminal coupled to a second terminal of said first resistor; and
a third resistor coupling said second terminal of said first and second resistors to a ground;
a first isolation FET having a source-drain path coupled from said first terminal of said pad to said input port; and
a second isolation FET having a source-drain path coupled from said second terminal of said pad to said output port.
8. A switched attenuation device, comprising:
an input port;
an output port;
a through-path FET having a source-drain path coupled between said input and output ports;
a pad having a first terminal and a second terminal, wherein said pad is a 20 dB pad;
a first isolation FET having a source-drain path coupled from said first terminal of said pad to said input port; and a second isolation FET having a source-drain path coupled from said second terminal of said pad to said output port.

9. A method of switching between two attenuation levels in a device having an input port and an output port, comprising:
routing a signal from said input port to said output port through a pad for attenuating said signal, said pad having a first terminal and a second terminal, wherein said signal is isolated from a source-drain path of a through-path FET, wherein said routing step comprises:
switching said through-path FET from a through state to an off state, said source-drain path of said through-path FET coupled between said input and output ports;
switching a first isolation FET from an off state to an on state, said first isolation FET having a source-drain path coupled from said first terminal of said pad to said input port; and
switching a second isolation FET from an off state to an on state, said second isolation FET having a source-drain path coupled from said second terminal of said pad to said output port.

10. The method of claim 9, wherein said through-path FET is a GaAs FET.

11. The method of claim 9, wherein:
a first resistor is coupled to a gate of said first isolation FET, said first resistor further coupled to a first voltage source;
a second resistor is coupled to a gate of said second isolation FET, said second resistor further coupled to a second voltage source; and
a third resistor is coupled to a gate of said through-path FET, said third resistor further coupled to a third voltage source.

12. The method of claim 11, wherein said first and second voltage sources are the same voltage source.

13. The method of claim 9, wherein a parallel resistor is coupled between said first and second terminals of said pad.

14. The method of claim 13, wherein a capacitor is coupled in series with said parallel resistor.

15. A method of switching between two attenuation levels in a device having an input port and an output port, comprising the steps of:
switching a through-path FET from a through state to an off state, said FET having a source-drain path coupled between said input and output ports; and
routing a signal from said input port to said output port through a pad having a first terminal and a second terminal, isolating said FET from said pad when said FET is in said off state, wherein said routing step comprises:
switching a first isolation FET from an off state to an on state, said first isolation FET having a source-drain path coupled from said first terminal of said pad to said input port; and
switching a second isolation FET from an off state to an on state, said second isolation FET having a source-drain path coupled from said second terminal of said pad to said output port;
wherein said pad comprises:
a first resistor having a first terminal coupled to said first terminal of said pad;
a second resistor having a first terminal coupled to said second terminal of said pad, and a second terminal coupled to a second terminal of said first resistor; and
a third resistor coupling said second terminal of said first and second resistors to a ground.

16. A method of switching between two attenuation levels in a device having an input port and an output port, comprising the steps of:
switching a through-path FET from a through state to an off state, said FET having a source-drain path coupled between said input and output ports; and
routing a signal from said input port to said output port through a pad having a first terminal and a second terminal, isolating said FET from said pad when said FET is in said off state, wherein said pad is a 20 dB pad.

* * * * *

UNITED STATES PATENT AND TRADEMARK OFFICE
CERTIFICATE OF CORRECTION

PATENT NO.    : 6,504,449 B1
DATED         : January 7, 2003
INVENTOR(S)   : Constantine et al.

It is certified that error appears in the above-identified patent and that said Letters Patent is hereby corrected as shown below:

<u>Title page,</u>
Item [73], Assignee, "le;.5qAnritsu Company, Morgan Hills" should read
-- [73] Assignee: Anritsu Company, Morgan Hill --

Signed and Sealed this

Tenth Day of June, 2003

JAMES E. ROGAN
*Director of the United States Patent and Trademark Office*